United States Patent
Vasseur et al.

(10) Patent No.: US 9,324,760 B2
(45) Date of Patent: Apr. 26, 2016

(54) CMOS INTEGRATED METHOD FOR FABRICATION OF THERMOPILE PIXEL ON SEMICONDUCTOR SUBSTRATE WITH BURIED INSULATION REGIONS

(71) Applicant: Excelitas Technologies Singapore Pte. Ltd., Solaris South Tower (SG)

(72) Inventors: Philippe Vasseur, Lachine (CA); Grigore D. Huminic, Baie D'Urfe (CA); Hermann Karagoezoglu, Wiesbaden (DE); Radu M. Marinescu, Pointe-Claire (CA)

(73) Assignee: Excelitas Technologies Singapore Pte. Ltd, Singapore (SG)

( * ) Notice: Subject to any disclaimer, the term of this patent is extended or adjusted under 35 U.S.C. 154(b) by 0 days.

(21) Appl. No.: 14/159,762

(22) Filed: Jan. 21, 2014

(65) Prior Publication Data

US 2015/0206919 A1      Jul. 23, 2015

(51) Int. Cl.

| | |
|---|---|
| *H01L 27/146* | (2006.01) |
| *G01J 5/02* | (2006.01) |
| *G01J 5/12* | (2006.01) |
| *H01L 21/76* | (2006.01) |
| *H01L 31/0236* | (2006.01) |

(52) U.S. Cl.
CPC ........... *H01L 27/14683* (2013.01); *G01J 5/024* (2013.01); *G01J 5/0225* (2013.01); *G01J 5/12* (2013.01); *H01L 21/76* (2013.01); *H01L 27/14649* (2013.01); *H01L 31/0236* (2013.01)

(58) Field of Classification Search
None
See application file for complete search history.

(56) References Cited

U.S. PATENT DOCUMENTS

| | | | | |
|---|---|---|---|---|
| 4,558,342 | A | * | 12/1985 | Sclar ............................. 257/460 |
| 5,059,543 | A | * | 10/1991 | Wise et al. ...................... 438/54 |
| 5,283,459 | A | * | 2/1994 | Hirano et al. ................. 257/419 |
| 6,165,854 | A | * | 12/2000 | Wu ............................. 438/296 |
| 6,294,787 | B1 | | 9/2001 | Schieferdecker et al. |

(Continued)

FOREIGN PATENT DOCUMENTS

| | | |
|---|---|---|
| DE | 4221037 A1 | 1/1994 |
| EP | 2416134 A1 | 2/2012 |

(Continued)

OTHER PUBLICATIONS

Extended European Search Report for EP14188311.6, dated Apr. 28, 2015.

(Continued)

*Primary Examiner* — Andres Munoz
(74) *Attorney, Agent, or Firm* — Peter A. Nieves; Sheehan Phinney Bass & Green PA

(57) ABSTRACT

A method for manufacturing an imaging device in a semiconductor substrate is disclosed. The substrate includes a first surface, a second surface substantially opposite the first surface, and a thickness defined by a distance between the first surface and the second surface. A trench is fabricated in the semiconductor substrate first surface. A passivation layer is applied over the substrate first surface and the trench, optionally filling the trench by depositing a conformal layer over the substrate first surface. The conformal layer and the passivation layer are planarized from the substrate first surface, and a membrane is fabricated on the substrate first surface. From the substrate second surface, a cavity is formed in the substrate abutting the membrane and at least a portion of the trench via the unmasked region.

16 Claims, 6 Drawing Sheets

(56) References Cited

U.S. PATENT DOCUMENTS

| | | | |
|---|---|---|---|
| 6,339,187 B1* | 1/2002 | Inoue | 136/225 |
| 6,476,455 B2* | 11/2002 | Toyoda et al. | 257/436 |
| 6,518,597 B1* | 2/2003 | Kim | 257/82 |
| 6,552,344 B1 | 4/2003 | Sone et al. | |
| 6,870,086 B2* | 3/2005 | Hamamoto et al. | 136/225 |
| 6,900,518 B2* | 5/2005 | Udrea et al. | 257/548 |
| 6,927,102 B2* | 8/2005 | Udrea et al. | 438/140 |
| 7,282,712 B2* | 10/2007 | Shibayama | 250/338.4 |
| 7,863,063 B2* | 1/2011 | Tan | 438/26 |
| 8,742,528 B2* | 6/2014 | Yamamura et al. | 257/436 |
| 8,758,650 B2* | 6/2014 | Marinescu et al. | 252/501.1 |
| 2004/0113076 A1* | 6/2004 | Guo et al. | 250/338.1 |
| 2004/0169144 A1* | 9/2004 | Shibayama | 250/338.1 |
| 2005/0176967 A1 | 8/2005 | Nakaki et al. | |
| 2006/0060788 A1* | 3/2006 | Uchida et al. | 250/343 |
| 2009/0184402 A1* | 7/2009 | Chen | 257/647 |
| 2010/0289108 A1* | 11/2010 | Meinel et al. | 257/467 |
| 2011/0248374 A1 | 10/2011 | Akin et al. | |
| 2012/0037591 A1 | 2/2012 | Tringe et al. | |
| 2013/0134542 A1 | 5/2013 | Lu et al. | |
| 2013/0206989 A1 | 8/2013 | Zhou et al. | |

FOREIGN PATENT DOCUMENTS

| | | |
|---|---|---|
| JP | H09-133578 A | 5/1997 |
| JP | 2012026861 A | 2/2012 |
| JP | 2012026934 A | 2/2012 |
| WO | WO9931471 | 6/1999 |
| WO | 2009026505 A1 | 2/2009 |
| WO | 2013089824 A1 | 6/2013 |
| WO | WO2013120652 A1 | 8/2013 |

OTHER PUBLICATIONS

T. Ishikawa, "Low Cost 320X240 uncooled IRFPA using conventional Silicon IC process." Opto-electronics Review, 1999, vol. 7. No. 4 pp. 297-303.

European Search Report for EP14196780, dated May 19, 2015.

European Search Report for EP14189733, dated Jun. 8, 2015.

Frank Niklaus et al; MEMS-Based Uncooled Infrared Bolometer Arrays—A Review; from conference vol. 6836, Nov. 11, 2007 in Beijing China; Proc. SPIE 6836, MEMS/MOEMS Technologies and Applications III, 68360D (Jan. 4, 2008); doi: 10.1117/12.755128; 15 pages.

* cited by examiner

CMOS INTEGRATED METHOD FOR FABRICATION OF THERMOPILE PIXEL ON SEMICONDUCTOR SUBSTRATE WITH BURIED INSULATION REGIONS

FIELD OF THE INVENTION

The present invention relates to semiconductor devices, and more particularly, is related to semiconductor wafer manufacturing processes.

BACKGROUND OF THE INVENTION

Infrared imagers are used in a large number of applications. Infrared imagers generally include an array of pixels. One limitation on the cost of producing infrared imagers is the pixel size. In general, a smaller pixel size allows the imager chip to have smaller dimensions, and thus a lower cost. However, previous manufacturing techniques for infrared imagers based on thermopiles as infrared sensing structures have been too imprecise to produce smaller pixels, for example, pixels with dimensions under 120 µm.

Imaging devices using thermopiles as sensing structures may include a thermopile structure suspended over a cavity in a semiconductor substrate, where a dielectric membrane of the thermopile has openings through to the cavity. Prior manufacturing methods have been challenged in ensuring the proper shape of the cavity under the membrane as well as a much higher precision in aligning this cavity with the position of the thermopile pixel. These features are especially needed when fabricating thermopile pixels which are smaller in size (for example, 120 µm or smaller).

When thermopile structures are integrated as pixels in CMOS integrated infrared imagers, a good insulation and passivation is desirable between the thermopile structures and the integrated circuitry. Previous methods of fabricating the thermopile pixels were based on anisotropic etching from the back of the membrane, which does not address the post etching effects, such as crystal defects, on integrated circuitry. Additionally, the anisotropic etching from the back of the membrane is not generally precise enough to ensure the correct positioning of the cavity under the membrane with high accuracy. For these reasons, a distance of 8-10 µm is desirable between the thermopile structures and CMOS circuitry. This increases significantly the pixel size.

In order to reduce the fabrication cost, it is desirable for infrared imagers to have a pixel size as small as possible, allowing for the imager chip to have smaller dimensions and, thus, a lower cost. Therefore, there is a need in the industry to improve one or more of the abovementioned deficiencies.

SUMMARY OF THE INVENTION

Embodiments of the present invention provide a CMOS integrated method for fabrication of a thermopile pixel on a semiconductor substrate with buried insulation regions. Briefly described, the present invention is directed to a method for manufacturing an imaging device in a semiconductor wafer having a substrate with a first surface, a second surface substantially opposite the first surface, and a thickness defined by a distance between the first surface and the second surface. The method includes the steps of fabricating a trench in the semiconductor substrate first surface, applying a passivation layer over the substrate first surface and the trench, planarizing the passivation layer from the substrate first surface, fabricating a membrane upon the substrate first surface, and from the substrate second surface, forming a cavity in the substrate abutting the membrane and at least a portion of the trench via the unmasked region.

Embodiments of the above method may further include the steps of filling the trench by depositing a conformal layer of a material over the substrate first surface, and planarizing the conformal layer from the substrate first surface. The material is selected from the group consisting of polysilicon, dielectric materials, polymer and metal.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1A:
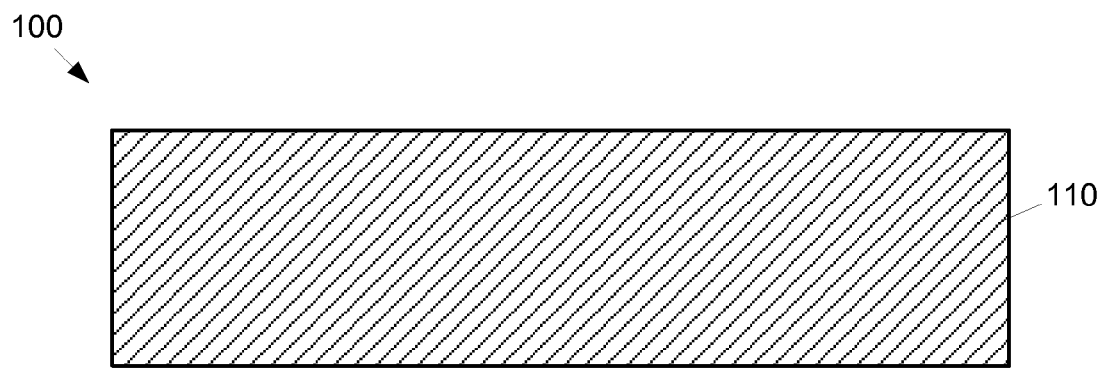
FIG. 1A is a schematic diagram of a wafer cross-section at the beginning of the exemplary method shown by FIG. 2.

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used within this disclosure, "isotropic" means that the process proceeds at the same rate, regardless of direction, for example, during an industrial process, such as etching steps. Simple chemical reaction and removal of a substrate by an acid, a solvent or a reactive gas is often very close to isotropic. Conversely, "anisotropic" means that the attack rate of the substrate is higher in a certain direction. Anisotropic etch processes, where vertical etch-rate is high, but lateral etch-rate is very small, are essential processes in microfabrication of integrated circuits and MEMS devices.

Reference will now be made in detail to embodiments of the present invention, examples of which are illustrated in the accompanying drawings. Wherever possible, the same reference numbers are used in the drawings and the description to refer to the same or like parts.

Exemplary embodiments of the present invention include a process for manufacturing an imaging device. The imaging device may be, for example, an infrared imager having an array of pixels, for example, but not limited to arrays of 32 by 32 pixels, 64 by 64 pixels, and 128 by 128 pixels. The imaging device includes a thermopile structure suspended over a cavity in a substrate having openings in the dielectric membrane. The thermopile is released from the substrate during the manufacturing process. An anisotropic etching of the silicon substrate under a central part of the membrane is performed from the back of the wafer. One or more topside trenches are formed in the silicon substrate.

The release of the membrane in the thermopile structures is performed by etching the silicon substrate underneath the membrane. This etching process may damage the nearby CMOS structures if the CMOS structures are exposed to the etching agents. Such etching also has the tendency to undercut outwards under the membrane, resulting in undesired variations in terms of size and position of the resulting cavity under the membrane. Exemplary embodiments of present invention include methods adding buried insulation trenches capable of acting as silicon etching stoppers. These trenches may be positioned in such way that they define the one or more boundaries of the cavity with high precision. Embodiments of the present method provide improved precision, for example, on the order of +/−0.5 µm precision, significantly better than the +/−4 µm precision of prior methods.

Figure 1B:
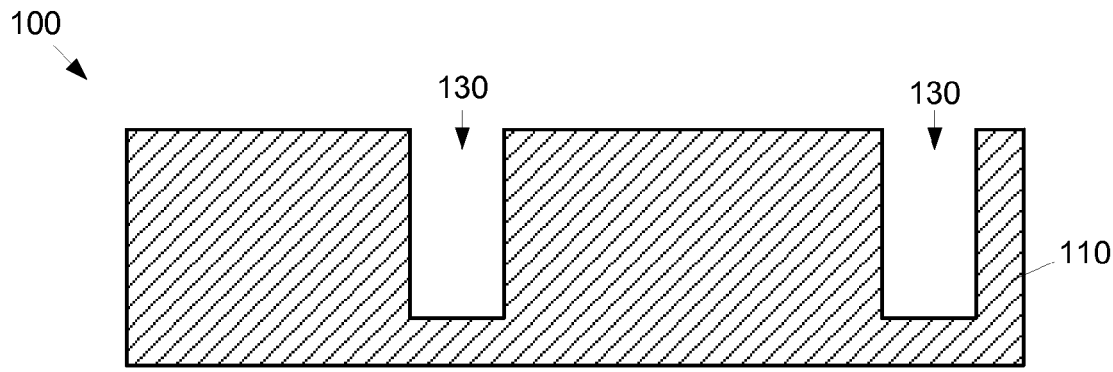
FIG. 1B is a schematic cross-section diagram of the wafer of the exemplary method shown by FIG. 2 after fabrication of trenches.
Figure 1C:
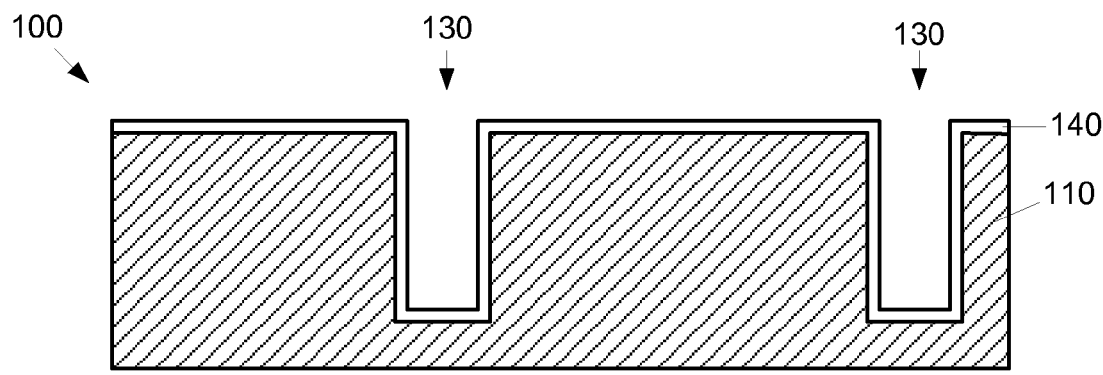
FIG. 1C is a schematic cross-section diagram of the wafer of the exemplary method shown by FIG. 2 after passivation.
Figure 1D:
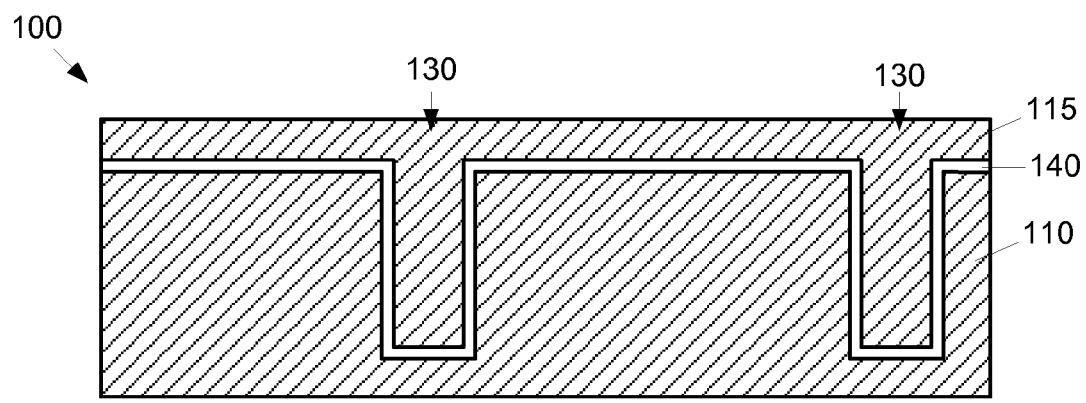
FIG. 1D is a schematic cross-section diagram of the wafer of the exemplary method shown by FIG. 2 after conformal layer deposition.
Figure 1E:
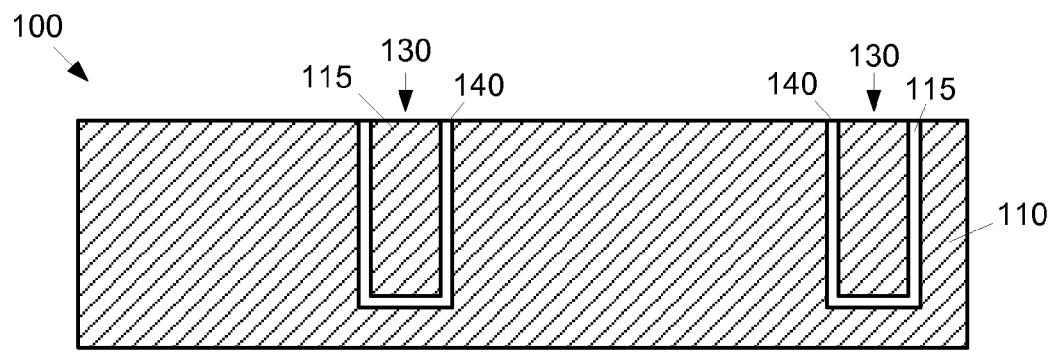
FIG. 1E is a schematic cross-section diagram of the wafer of the exemplary method shown by FIG. 2 after planarization.
Figure 1F:
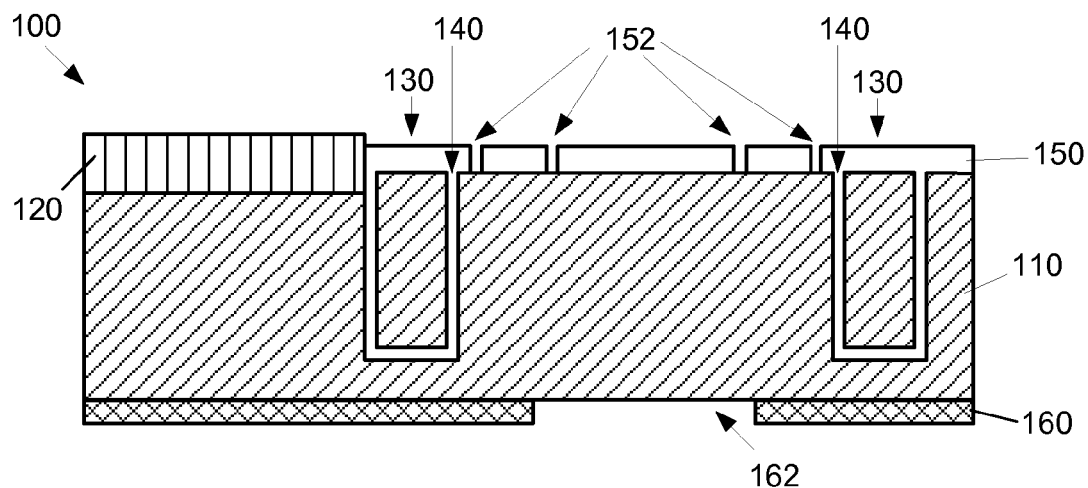
FIG. 1F is a schematic cross-section diagram of the wafer of the exemplary method shown by FIG. 2 after fabrication of CMOS and thermopile structures.
Figure 1G:
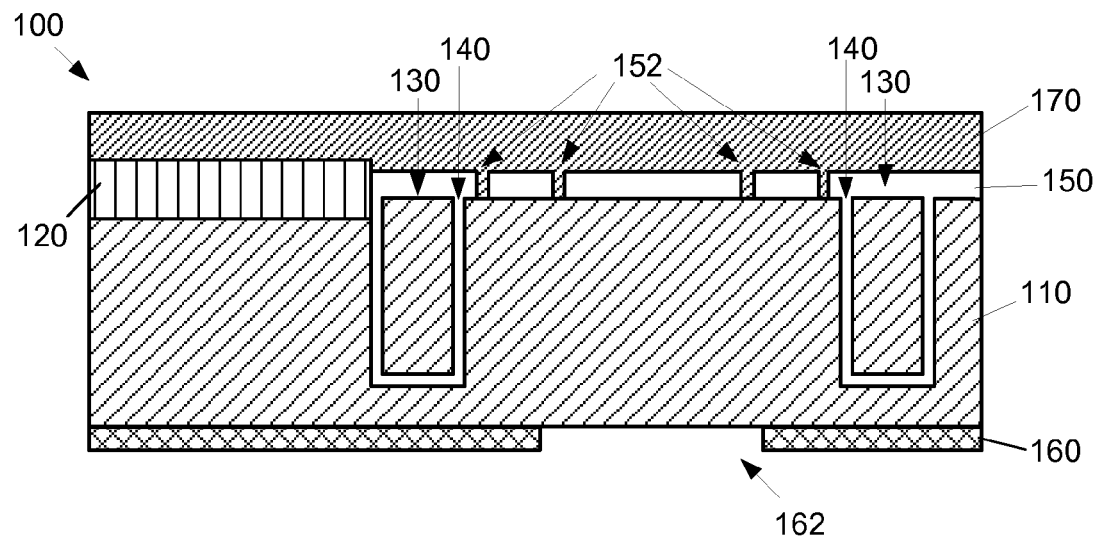
FIG. 1G is a schematic cross-section diagram of the wafer of the exemplary method shown by FIG. 2 after photoresist deposition.
Figure 1H:
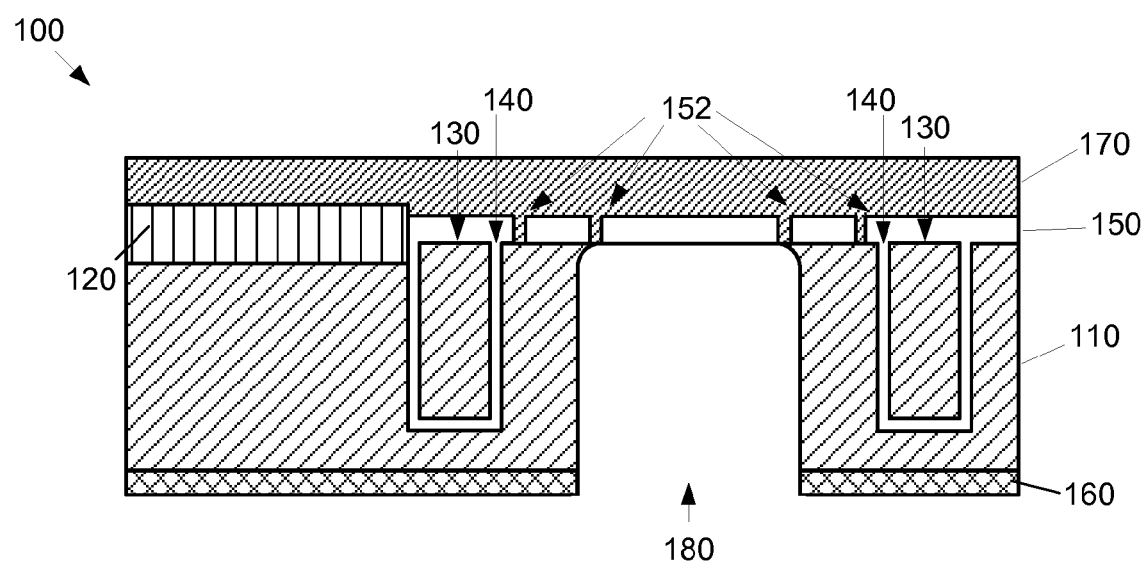
FIG. 1H is a schematic cross-section diagram of the wafer of the exemplary method shown by FIG. 2 after DRIE cavity etching.
Figure 1I:
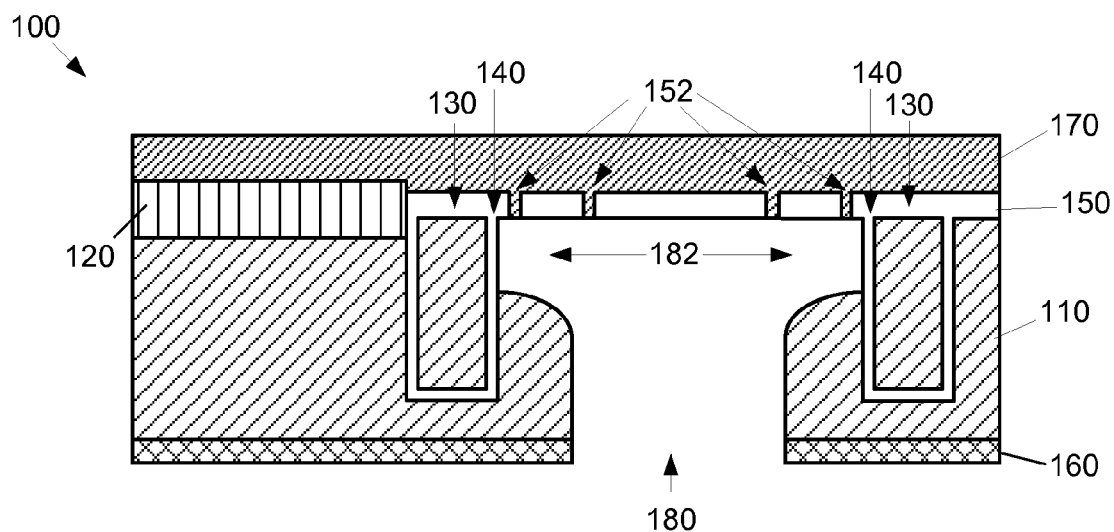
FIG. 1I is a schematic cross-section diagram of the wafer of the exemplary method shown by FIG. 2 after finishing the DRIE process with notching.
Figure 1J:
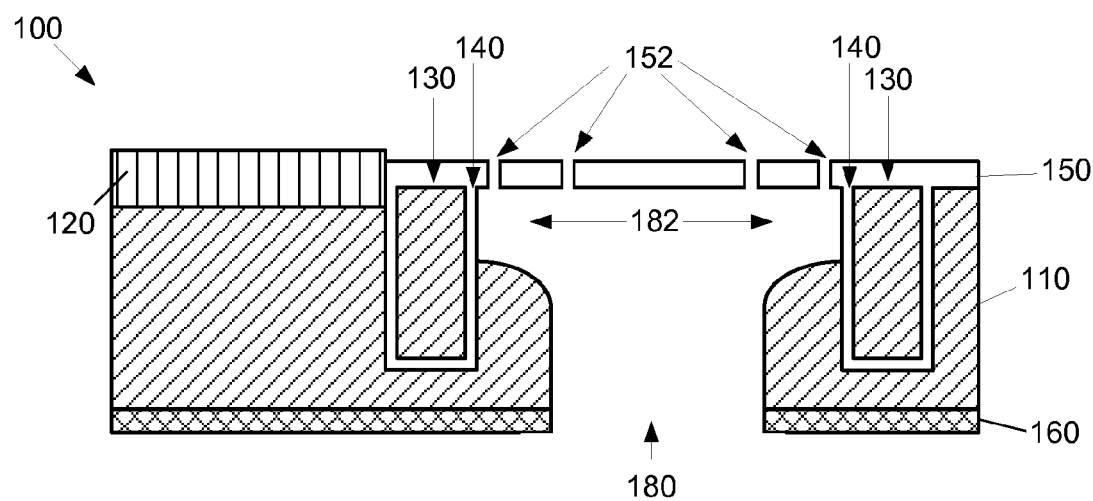
FIG. 1J is a schematic cross-section diagram of the wafer of the exemplary method shown by FIG. 2 after removing the photoresist layer.
Figure 2:
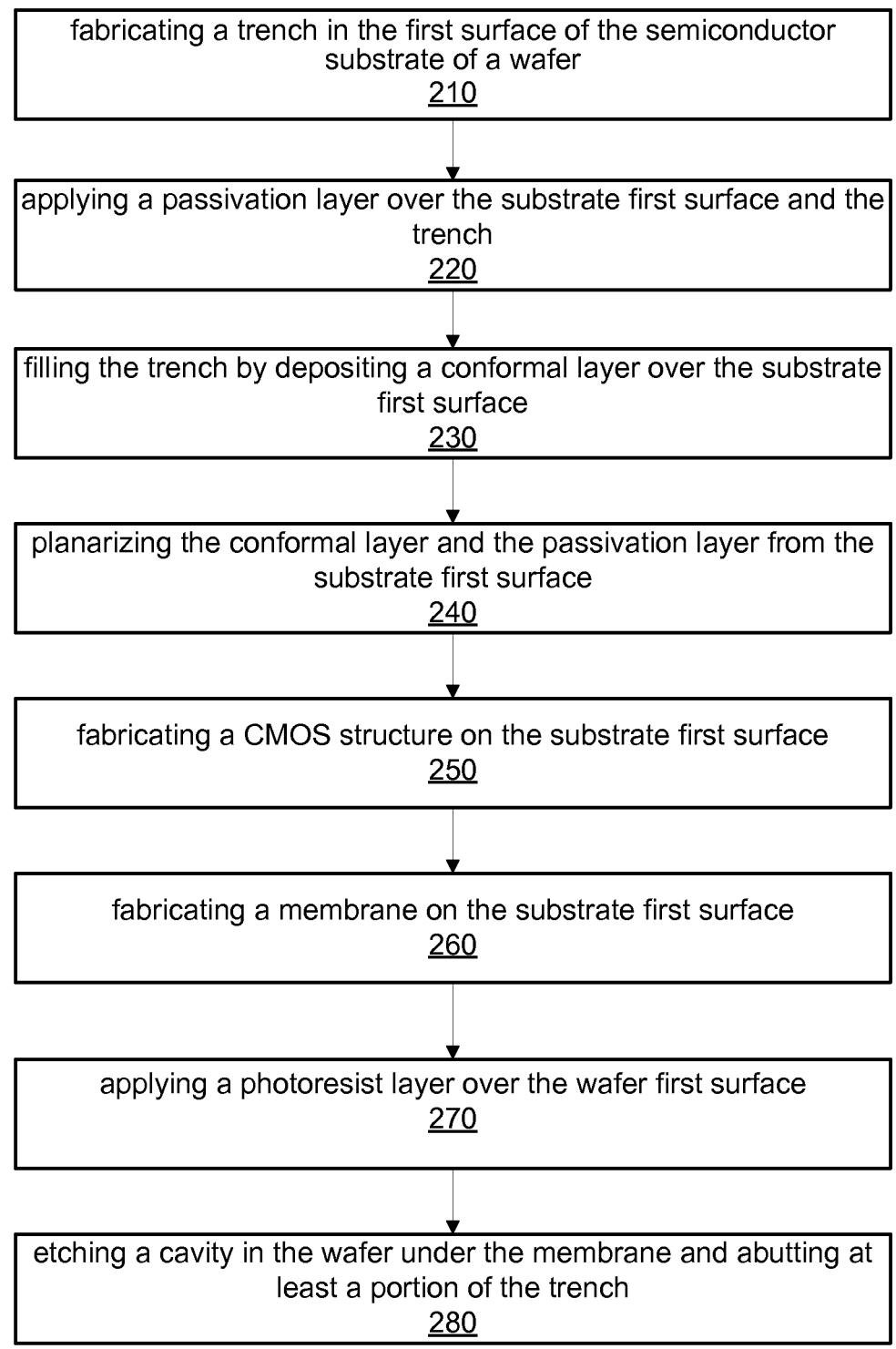
FIG. 2 is a flowchart of a first exemplary method of forming an imaging device.

A flowchart of a first exemplary method for manufacturing an imaging device is shown in FIG. 2. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The state of the imaging device at various steps of the first exemplary embodiment is shown in cross-section by FIGS. 1A-1J.

The first embodiment 200 of a method for manufacturing an imaging device includes the following steps. One or more trenches 130 are fabricated in a semiconductor substrate 110 first (top/front) surface of a wafer 100 as shown by block 210 and FIGS. 1A and 1B. The substrate 110 is generally formed of an appropriate semiconductor material, for example silicon, germanium, silicon germanium, or gallium arsenide, properly doped in order to accommodate the fabrication of the CMOS structures 120 (FIG. 1F). Details of this fabrication are provided below. It should be noted that while FIGS. 1B-1J depict two distinct trenches 130, the trenches 130 may instead be part of a single trench 130 surrounding a portion of the substrate 110 first surface, for example, in a circular, square, or rectangular pattern, among other possible shapes, so that the cross sectional views of FIGS. 1B-1J show two cross-sectional slices of a single trench 130. While the cross sectional shape of the trenches 130 are depicted as being substantially rectangular in shape with a flat base and vertical sides, there is no objection to trench profiles having other shapes, for example, a substantially V shaped or U shaped profile.

A passivation layer 140 is applied over the substrate 110 first surface and the trenches 130 as shown by block 220 and FIG. 1C. The trenches 130 are substantially overlayed by the material of the passivation layer 140. The passivation layer may be fabricated of silicon dioxide (either thermally grown or deposited), silicon nitride or other dielectric material. The passivation layer 140 material generally resists one or more etching agents, for example, dry anisotropic etching agents, for example, as used for deep reactive ion etching (DRIE).

The trench 130 may be filled by depositing a conformal layer 115 over the substrate 110 first surface and passivation layer 140, as shown by block 230 and FIG. 1D. The conformal layer 115 may completely fill the trench(es) 130 and overlay the passivation layer 140, as shown in FIG. 1D. In alternative embodiments, the conformal layer 115 may only partially fill the trench(es) 130. Among other advantages, the passivation layer 140 serves to electrically isolate the conformal layer 115 within the trenches 130 from the substrate 110.

The conformal layer 115 and/or the passivation layer 140 are planed from the substrate 110 first surface as shown by block 240 and FIG. 1E. The trenches 130 remain lined with the passivation layer 140 and the trenches 130 remain filled or partially filled with the conformal layer 115 material. The planarization effectively removes both the conformal layer 115 and the passivation layer 140 from the first surface of the substrate 110, and, as noted above, electrically isolates the conformal layer 115 filling the trenches 130 from the substrate 110 material. The conformal layer 115 may include one or more materials, for example, polysilicon, dielectric materials, polymer, or metals, among other materials.

One or more CMOS structures 120 are fabricated on the wafer 100 as shown by block 250 and FIG. 1F. The CMOS structure(s) 120, for example, but not limited to shift registers and NMOS switches, is fabricated on the substrate 110 first surface using a customized CMOS process. A portion of the CMOS structure(s) 120 may extend above the substrate 110 first surface while another portion may be embedded beneath the substrate 110 first surface as shown by FIG. 1F. It should be noted that while FIGS. 1A-1J depict a single CMOS structure 120 in a single location on the wafer 100, alternative embodiments may include two or more CMOS structures on different locations of the wafer 110.

The CMOS process is customized in such way that, simultaneously with the CMOS structures 120, a membrane 150 is fabricated by growth and deposition of dielectric films on the substrate first surface, as shown by block 260 and FIG. 1F. The membrane 150 has openings 152, which expose a portion of the substrate 110 first surface. The membrane openings 152 may be of various shapes, for example, circular, or the membrane openings 152 may be straight or curved slots in the membrane 150. The membrane 150 is generally formed of one or more dielectric layers such as silicon dioxide and silicon nitride, incorporating thermopile structures fabricated in materials such as polysilicon. The membrane 150 may be deposited on the substrate 110 via several techniques familiar to persons having ordinary skill in the art, for example, low pressure vapor deposition or plasma enhanced vapor deposition, among other techniques.

The membrane 150 may be formed of the same material as the passivation layer 140, so that portions of the membrane 150 may be bonded to the passivation layer 140 material lining the trenches 130.

A mask layer 160 may be deposited upon a second (back/bottom) side of the substrate 110. The mask layer 160 may be a photoresist layer or metal layer, for example aluminum or chromium, to resist dry anisotropic etching agents, for example fluorine-based agents, as used for deep reactive ion etching (DRIE). An opening 162 in the mask layer 160 exposes the substrate 110 back side. The opening 162 is shaped according to the desired shape of a cavity to be formed in the substrate 110 behind a central portion of the membrane 150. For example, the shape of the opening 162 may be rectangular, or circular, among other shapes. The opening 162 is generally located according to the location of the central portion of the membrane 150. The opening 162 may also be located such that a back side cavity 180 (FIG. 1H) is centered with respect to the trench(es) 130 and/or the membrane 150.

The substrate 110 of the wafer 100 is generally thicker than the membrane 150. A non-limiting exemplary range of thicknesses of the substrate 110 may be 300-600 μm, while a non-limiting exemplary thickness range of the membrane 150 may be 0.5-1.5 μm. It should be noted that the dimensions of the various elements of the wafer 100 in FIGS. 1A-1J may not be depicted proportionally or to scale.

A photoresist layer 170 is applied over the substrate 110 first surface as shown by block 270 and FIG. 1G. The photoresist layer 170 is deposited, for example, by spinning or spray coating over the membrane 150, the CMOS structures 120, and the portions of the wafer 110 first surface exposed through the holes 152 in the membrane 150. The photoresist layer 170 is generally a positive resist, where any portion of the photoresist 175 that is exposed to light becomes soluble to a photoresist developer.

The photoresist layer 170 covers the membrane 150, portions of the substrate 110 exposed by the membrane openings 152, and the CMOS structures 120. The CMOS structures 120 are generally vulnerable to anisotropic and/or isotropic etching agents and procedures, so it is desirable to protect the CMOS structures 120 from the regions where etching is performed. The photoresist layer 170 provides a protection for the CMOS structures 120 against the etching agents used in subsequent stages of manufacture.

A cavity 180 is etched in the substrate under the membrane and abutting at least a portion of the trench as shown by block 280 and FIGS. 1H and 1I. A portion of the substrate 110 second surface under a central portion of the membrane 150 is etched by anisotropic etching as shown by FIG. 1H, to form an initial cavity 180 in the substrate 110 between the trenches 130. For example, the initial cavity 180 may be formed in a region of the substrate 110 located directly below the central portion of the membrane 150. The cavity 180 is formed by removing a portion of the substrate 110 revealed by the hole 162 (FIG. 1G) in the mask layer 160. This initial cavity 182 generally does not extend laterally to reach the trenches 130. The profile shape of the initial cavity generally corresponds to the shape of the hole 162 (FIG. 1G) in the mask layer 160. However, there may be some rounding at the corners of the initial cavity 180 where the initial cavity abuts the membrane 150. While FIG. 1H shows the initial cavity 180 abutting the membrane 150 and not abutting the photoresist 170 filling the openings 152 in the membrane 150, in alternative embodiments the initial cavity 180 may abut the photoresist 170 filling the openings 152 in the membrane 150. Subsequently, the etching from the backside continues with a notching process, which widens a portion of the initial cavity 180 adjacent to the membrane 150. The notching process extends the portion of the initial cavity 180 adjacent to the membrane 150 outward to abut the trench(es) 130. In particular, a notched cavity region 182 extends from the initial cavity 180 such that a portion of the passivation layer 140 lining the trench(es) 130 is opened from the initial cavity 180, as shown by FIG. 1I.

The etching of the initial cavity 180 is performed from the back of the substrate 110 using an anisotropic etching process, for example, DRIE. The etching generally penetrates through the whole thickness of the substrate 110. In general, irregularities in the initial cavity 180 remaining after DRIE may be cleaned/removed, for example, with wet tetramethyl ammonium hydroxide (TMAH) etching solution. It should be noted that while TMAH is a highly aggressive etchant, and without taking preventative measures will attack other structures on the wafer 100 such as the CMOS structures 120. For that reason, the CMOS structures 120 are protected, for example with photoresist, during the immersion in the TMAH solution.

The photoresist layer 170 (FIG. 1I) may be stripped, as shown by FIG. 1H, thereby releasing the membrane 150. This removal of the photoresist layer 170 (FIG. 1F) exposes the openings 152 in the membrane 150, as well as the CMOS structure(s) 120. The cavity 180, 182 in the substrate 110 is exposed through the openings 152 in the membrane 150.

The result of the above described method is a thermopile structure having a membrane 150 with opening over a cavity 180, 182 in the substrate 110. The cavity 180, 182 is substantially wider in a portion directly beneath the membrane 150, and is substantially narrower at the second surface of the substrate 110. The wider portion of the cavity 180, 182 is bounded by the trench 130. The trench 130 therefore allows for high precision in forming a portion of the cavity 180, 182 located directly beneath the membrane 150.

Figure 3A:
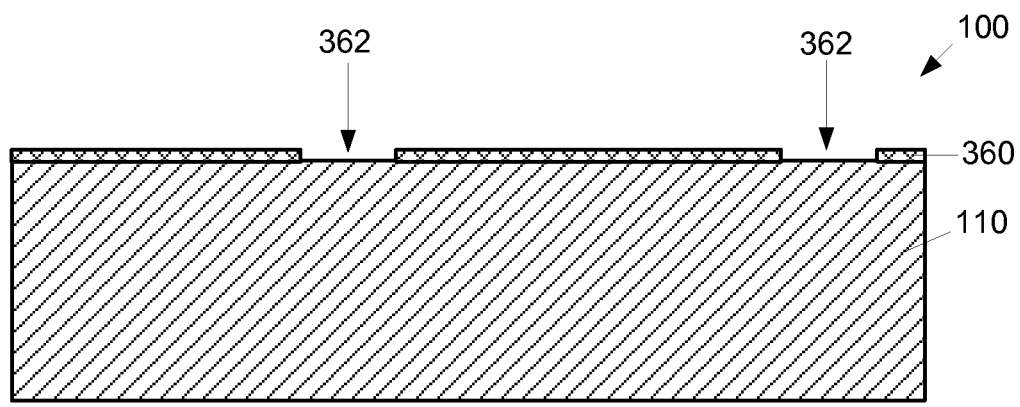
FIG. 3A is a schematic cross-section diagram of the wafer of the exemplary method shown by FIG. 2 with masks for trenches.

Fabrication of the trenches 130 in the substrate 110 may be performed by one or more processes familiar to persons having ordinary skill in the art. For example, as shown in FIG. 3A, a mask layer 360 may be bonded to the second first side of the substrate 110. The mask layer 360 may be a metal layer, for example to resist dry anisotropic etching agents, for example, as used for DRIE. One or more openings 362 in the mask layer 360 expose the substrate 110 top side. The openings 362 are shaped according to the desired shape of a trench 130 (FIG. 3B) to be formed in the substrate 110.

Figure 3B:
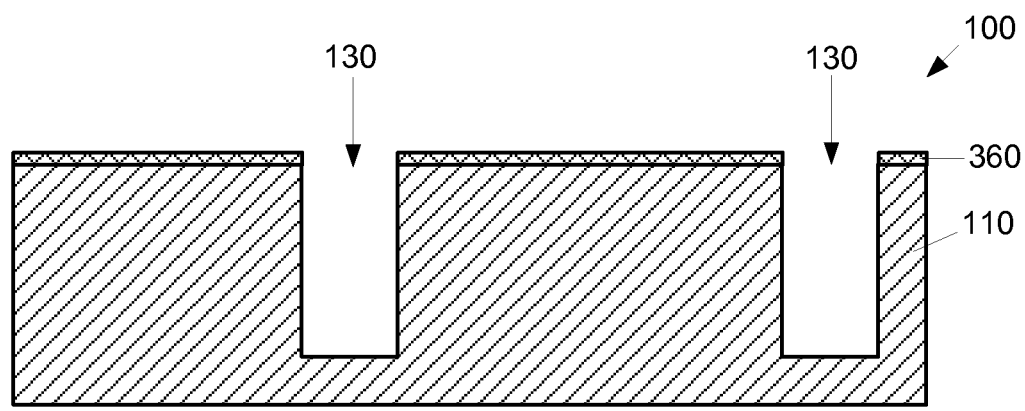
FIG. 3B is a schematic cross-section diagram of the wafer of the exemplary method shown by FIG. 2 after front side DRIE etching.

DRIE may be performed on the front surface of the substrate 110 through the openings 362 to form the trenches 130 in the wafer 100, as shown by FIG. 3B. The mask layer 360 may then be stripped, as shown by FIG. 1B. The etching agent for the DRIE of the trenches may be the same etching agent used for etching the initial cavity 180, or may be a different etching agent.

As described above, the exemplary method ensures the proper shape of the cavity 180, 182 under the membrane 150 as well as providing much higher precision in aligning this cavity with the position of the thermopile pixel when compared to prior methods. This is particularly relevant when fabricating thermopile pixels which are relatively small in size, for example, 120 μm or smaller.

As noted above, previous methods of fabricating the thermopile pixels were based only on anisotropic etching from the back of the membrane, which does not deal with the post etching effects (mainly crystal defects) on the integrated circuitry. Therefore, a distance of 8-10 μm is desirable between the thermopile structures and CMOS circuitry. Prior art methods of releasing the membrane for thermopile pixels were based on anisotropic etching from the back of the membrane, which is not precise enough to ensure the correct positioning of the cavity under the membrane. The method of the present invention ensures +/−0.5 μm precision in the position and shape of the cavity, significantly better than the +/−4 μm precision ensured by the prior methods. Further, the method of the present invention allows location of pixels and at least one CMOS structure within 4 μm or less of one another.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an imaging device in a semiconductor wafer comprising a substrate with a first surface, a second surface substantially opposite the first surface, and a thickness defined by a distance between the first surface and the second surface, comprising the steps of:
   fabricating a trench in the first surface;
   applying a passivation layer over the first surface and the trench;
   planarizing the passivation layer to remove a portion of the passivation layer from the first surface;
   fabricating a membrane upon the first surface;
   applying a first mask to the second surface, wherein an unmasked region of the second surface corresponds to a membrane central reion and wherein the first mask defines a cavity profile shape; and
   from the second surface, forming a cavity in the substrate abutting the membrane and at least a portion of the trench via the unmasked region of the second surface,
   wherein forming the cavity in the substrate further comprises etching the cavity having a shape substantially according to the cavity profile shape, and extending a portion of the cavity substantially adjacent to the membrane to abut at least a portion of the trench.

2. The method of claim 1, further comprising the step of fabricating a complementary metal-oxide semiconductor (CMOS) structure on the first surface.

3. The method of claim 1, wherein the membrane comprises an opening exposing the first surface before forming the cavity or the cavity.

4. The method of claim 1, wherein the etching is deep reactive ion etching (DRIE).

5. The method of claim 1, wherein fabricating the trench in the first surface further comprises the step of applying a second mask to the first surface, wherein the second mask defines a trench profile shape.

6. The method of claim 5, wherein fabricating the trench in the substrate further comprises the step of deep reactive ion etching (DRIE) etching the trench having a shape substantially according to the trench profile shape.

7. The method of claim 6, wherein fabricating the trench in the substrate further comprises the step of stripping the second mask from the first surface.

8. The method of claim 1, wherein the trench has a depth less than the thickness of the substrate.

9. The method of claim 1, further comprising the steps of:
   depositing a conformal layer of a material over the first surface; and
   planarizing the conformal layer from the first surface to remove a portion of the conformal layer,
   wherein depositing the conformal layer at least partially fills the trench.

10. The method of claim 9, wherein the material is selected from the group consisting of polysilicon, dielectric materials, polymer, and metal.

11. A method for manufacturing an imaging device in a semiconductor wafer comprising a substrate with a first surface, a second surface substantially opposite the first surface, and a thickness defined by a distance between the first surface and the second surface, comprising the steps of:
   fabricating a trench in the first surface;
   applying a passivation layer over the first surface and the trench; planarizing the passivation layer to remove a portion of the passivation layer from the first surface;
   fabricating a membrane upon the first surface;
   applying a photoresist layer over the first surface;
   from the second surface, forming a cavity in the substrate abutting the membrane and at least a portion of the trench via an unmasked region of the second surface, wherein the cavity is formed via etching and wherein the membrane comprises an opening exposing the first surface before forming the cavity or the cavity; and
   after etching the cavity, stripping the photoresist layer.

12. A method for manufacturing an imaging device in a semiconductor wafer comprising a substrate with a first surface, a second surface substantially opposite the first surface, and a thickness defined by a distance between the first surface and the second surface, comprising the steps of:
   fabricating a trench in the first surface;
   applying a passivation layer over the trench;
   fabricating a membrane upon the first surface;
   applying a first mask to the second surface, wherein an unmasked region of the second surface corresponds to a membrane central region, the first mask defining a cavity profile shape; and
   from the second surface, forming a cavity in the substrate abutting the membrane and at least a portion of the trench via the unmasked region of the second surface,
   wherein forming the cavity in the substrate further comprises etching the cavity having a shape substantially according to the cavity profile shape, and extending a portion of the cavity substantially adjacent to the membrane to abut at least a portion of the trench.

13. The method of claim 12, wherein the etching is deep reactive ion etching (DRIE).

14. The method of claim 12, wherein fabricating the trench in the first surface further comprises the step of applying a second mask to the first surface, wherein the second mask defines a trench profile shape.

15. The method of claim 14, wherein fabricating the trench in the substrate further comprises the step of deep reactive ion etching (DRIE) etching the trench having a shape substantially according to the trench profile shape.

16. The method of claim 14, further comprising the steps of:
   depositing at least one layer selected from the group consisting of the passivation layer and a conformal layer of a material over the first surface prior to fabricating the membrane upon the first surface; and
   planarizing the at least one layer to remove a portion of the at least one passivation layer and the conformal layer from the first surface,
   wherein depositing the at least one layer at least partially fills the trench.

* * * * *